United States Patent [19]

Ajika et al.

[11] Patent Number: 5,049,975
[45] Date of Patent: Sep. 17, 1991

[54] MULTI-LAYERED INTERCONNECTION STRUCTURE FOR A SEMICONDUCTOR DEVICE

[75] Inventors: Natsuo Ajika; Hideaki Arima, both of Hyogo, Japan

[73] Assignee: Mitsubishi Denki Kabushiki Kaisha, Tokyo, Japan

[21] Appl. No.: 492,032

[22] Filed: Mar. 12, 1990

[30] Foreign Application Priority Data

Mar. 14, 1989 [JP] Japan .................................. 1-63066
Sep. 27, 1989 [JP] Japan ................................. 1-250890

[51] Int. Cl.$^5$ .......................................... H01L 23/48
[52] U.S. Cl. ..................................... 357/71; 357/23.5; 365/185
[58] Field of Search ................... 357/71, 71 R, 71 S, 357/23.5; 365/185

[56] References Cited

U.S. PATENT DOCUMENTS

| 4,558,339 | 12/1985 | Angle | 365/185 |
| 4,590,503 | 5/1986 | Harai et al. | 365/185 |
| 4,599,706 | 7/1986 | Guterman | 365/185 |
| 4,792,842 | 12/1988 | Honma et al. | 357/71 R |
| 4,870,615 | 9/1989 | Maruyama et al. | 365/185 |
| 4,887,146 | 12/1989 | Hinode | 357/71 |

FOREIGN PATENT DOCUMENTS

| 60-9168 | 1/1985 | Japan | 357/23.5 |
| 61-156872 | 7/1986 | Japan | 357/71 |
| 61-174767 | 8/1986 | Japan | 357/71 |
| 61-194877 | 8/1986 | Japan | 357/23.5 |
| 61-216482 | 9/1986 | Japan | 357/23.5 |
| 62-60267 | 3/1987 | Japan | 357/23.5 |

*Primary Examiner*—Rolf Hille
*Assistant Examiner*—Steven Loke
*Attorney, Agent, or Firm*—Lowe, Price, LeBlanc and Becker

[57] ABSTRACT

An interconnection layer of a semiconductor device according to the present invention has in a contact portion with a conductor layer a multi-layered structure formed from the bottom, of a refractory metal silicide layer, a first refractory metal nitride layer, and a second refractory metal nitride layer. Titanium or tungsten is used as a refractory metal. The second refractory metal nitride is formed by thermally nitriding the refractory metal layer. The second refractory metal nitride layer formed by the thermal process has a close packed crystal structure and has an excellent barrier characteristic.

5 Claims, 5 Drawing Sheets

MULTI-LAYERED INTERCONNECTION STRUCTURE FOR A SEMICONDUCTOR DEVICE

BACKGROUND OF THE INVENTION

1. Field of the Invention

The present invention relates generally to interconnections for semiconductor devices, and more particularly, to semiconductor device multilayer interconnection layers having improved interfusion barrier characteristics. The invention relates further to manufacturing methods therefor.

2. Description of the Background Art

The following characteristics are required for an interconnection layer which electrically connects in a semiconductor device an active element such as a transistor and a diode to another active element or to a passive element such as a resistor and a capacitor on a chip, (1) Interconnection bulk resistivity is small, (2) Contact resistance to a material to be connected thereto is small and formation of an ohmic contact is possible, (3) Formation of film is easy and formation of a miniaturized interconnecting pattern is possible, (4) High immunity to electromigration and erosion, and high reliability.

At present no material is found which fills all these requirements. However, an aluminum interconnection has the smallest interconnection resistance and is easy to be manufactured, so that it is most widely used at present. However, as a semiconductor device has been highly integrated in recent years, interconnection structure is miniaturized. As a result, various problems occur. These problems will be described in reference to FIGS. 5A and 5B. FIGS. 5A and 5B are partially sectional views of a structure of a semiconductor device including an aluminum interconnection layer. In the drawing, an n type impurity region 2 is formed on a surface of a p type silicon substrate 1. A major surface of the p type silicon substrate 1 is covered with an interlayer insulating film 3. A contact hole 4 is formed in the interlayer insulating film 3. The contact hole 4 reaches a surface of the n type impurity region 2. An aluminum interconnection layer 5 is formed in the interlayer insulating film 3 and the contact hole 4. The aluminum interconnection layer 5 is connected to the surface of the n type impurity region 2 at a bottom of the contact hole 4.

In the structure shown in FIG. 5A, interdiffusion occurs between the aluminum interconnection layer 5 and the p type silicon substrate 1 when heat treatment is applied during manufacturing. As a result, the aluminum breaks into the p type silicon substrate 1 to form a large number of concaves. This is generally referred to as alloy spike phenomenon. Then, an alloy spike 6 tends to break a pn junction which is formed in a shallower manner as a degree of integration is increased, resulting in leakage or short-circuit.

In order to prevent the alloy spike phenomenon, the structure shown in FIG. 5B is used in which the aluminum interconnection layer 5 includes silicon. However, in this case, a silicon nodule 7 is formed in the contact region between the surface of an n type impurity region 2 formed in p type silicon substrate 1 and the aluminum interconnection 5, thereby increasing a contact resistivity, which poses a new problem.

As another solution to the alloy spike phenomenon or a formation of a silicon nodule, an interconnection structure using a barrier metal layer has been proposed. The structure will be described in reference to FIGS. 6A and 6B. First as shown in FIG. 6A, a titanium layer 8 of a film thickness of about 1,000Å is formed on a surface of an interlayer insulating film 3 and in a contact hole 4 using sputtering method.

Then, as shown in FIG. 6B, the titanium layer 8 is annealed in a nitriding atmosphere such as nitrogen ($N_2$) or ammonium ($NH_3$) gas. A titanium nitride (TiN) layer 9 is formed on a surface of the titanium layer 8 by this thermal process. In addition, a titanium silicide layer 10 is formed in a contact portion between the titanium layer 8 and the surface of the n type impurity region 2 formed in the p type silicon substrate 1. Film thickness of the titanium layer 8, the titanium nitride layer 9 and the titanium silicide layer 10 are 700–800Å, 200–300Å and 2000Å, respectively. Usually for thermal processing, silicidation is several times faster in reaction rate than nitriding. Therefore, the titanium silicide layer 10 is formed having a very large film thickness as compared with the titanium nitride layer 9. Thereafter, the aluminum conductive layer 5 is formed on a surface of the titanium nitride layer 9. A protection film 11 of a plasma CVD oxide film is formed on a surface of the aluminum conductive layer 5.

In the structure shown in FIG. 6B, the barrier metal layer has a double-layered structure formed of the titanium silicide layer 10 and the titanium nitride layer 9. The titanium silicide layer 10 forms a good ohmic contact with the n type impurity region 2 formed on the p type silicon substrate 1. In addition, the titanium nitride layer 9 acts as a barrier for preventing interdiffusion between the aluminum conductive layer 5 and the p type silicon substrate 1.

In the barrier metal layer of the double-layered structure, problem is that a film thickness of the titanium silicide layer 10 is thicker than that of the titanium nitride layer 9. More specifically, in the above described annealing step, since reaction of the titanium silicide layer 10 is fast, silicidation in the n type impurity region 2 proceeds before the formation of the titanium nitride layer 9 of a predetermined film thickness, which might destroy a shallow junction of the n type impurity region 2 and the silicon substrate 1.

A further improvement is introduced to overcome this problem. A second example of the interconnection structure including a barrier metal layer will be described in reference to FIGS. 7A and 7B.

First as shown in FIG. 7A, a titanium layer 8 of a film thickness of about 200Å is formed on a surface of an interlayer insulating film 3 and in a contact hole 4. Furthermore, a titanium nitride layer 9 of a film thickness of about 1,000Å is deposited on a surface of the titanium layer 8 using reactive sputtering method.

Then, as shown in FIG. 7B, by a thermal process in the nitriding atmosphere, a titanium silicide layer 10 is formed in a contact region between the titanium layer 8 and the n type impurity region 2. The titanium silicide layer 10 is formed to have a film thickness of about 300–400Å. Thereafter, an aluminum conductive layer 5 is formed. In addition, a protection film 11 such as plasma CVD oxide film is formed on a surface of the aluminum conductive layer 5.

The above described structure is described, for example, in "The Use of Titanium-Based Contact Barrier Layers in Silicon Technology" by C. Y. TING, et al. Thin Solid Films 96 (1982) 327–345.

In such a structure, the titanium nitride layer 9 having a barrier characteristic can be formed to have any film thickness. In addition, a film thickness of the titanium silicide layer 10 formed in the contact portion with the interconnection layer can be made small. However, the titanium nitride layer 9 is formed by reactive sputtering method. The titanium nitride layer 9 formed by reactive sputtering has a crystal structure which is not a close-packed structure and has a poor barrier characteristic. FIG. 8 is a schematic diagram of the crystal structure of the titanium nitride layer 9 formed by the reactive sputtering. Referring to the drawing, the titanium nitride layer 9 has a crystal structure in which crystalline grains extend in the form of columns. In such a crystal structure, there occurs grain boundary diffusion that silicon or the like diffuses along the grain boundary. Accordingly, it has the disadvantage that interdiffusion between the interconnection layer 5 and the n type impurity region 2 could not be completely prevented.

SUMMARY OF THE INVENTION

An object of the present invention is to provide a semiconductor device comprising an interconnection layer having an improved barrier characteristic in a contact portion.

Another object of the present invention is to provide a semiconductor device comprising an interconnection layer having barrier metal layer of a multi-layered structure.

A further object of the present invention is to make a close packed crystal structure of a barrier metal layer.

Still another object of the present invention is to improve controllability of a film thickness of a silicide layer formed on a surface of an impurity region.

An interconnection layer of a semiconductor device according to the present invention forms a barrier metal layer having a multi-layered structure between an impurity region formed in a substrate made either of silicon or polycrystalline silicon, and an interconnecting conductor layer. The barrier metal layer is structured by a first refractory metal silicide layer, a first refractory metal nitride layer and a second refractory metal nitride layer which are deposited in this order from the bottom. Each of the barrier metal layers has the following effects. The most underlying silicide layer forms a good ohmic contact with an impurity region in a silicon substrate or a polysilicon layer. The most upper second refractory metal nitride layer is formed by a thermal nitriding process, which makes a close packed crystal structure to be an excellent barrier. The second refractory metal nitride layer prevents interdiffusion of such as silicon between the overlying interconnecting conductor layer and the silicon substrate.

The intermediate first refractory metal nitride layer is formed by sputtering or CVD method. The intermediate layer secures a predetermined film thickness of the second refractory metal nitride layer formed thereon. More specifically, in a manufacturing step, a refractory metal layer is formed on an upper surface of the intermediate layer. Thereafter, the refractory metal layer is converted into the second refractory metal nitride layer by a thermal nitride process. In this step, existence of the intermediate layer prevents silicidation of the underlying refractory metal layer from extending to the overlying refractory metal layer.

An interconnection layer comprises the above described three-layered structure, in which a barrier metal layer having an excellent barrier characteristic and having a good ohmic contact is interposed.

The foregoing and other objects, features, aspects and advantages of the present invention will become more apparent from the following detailed description of the present invention when taken in conjunction with the

FG. 5A and 5B are sectional views showing a structure of a conventional general aluminum interconnection.

Figure 6A:
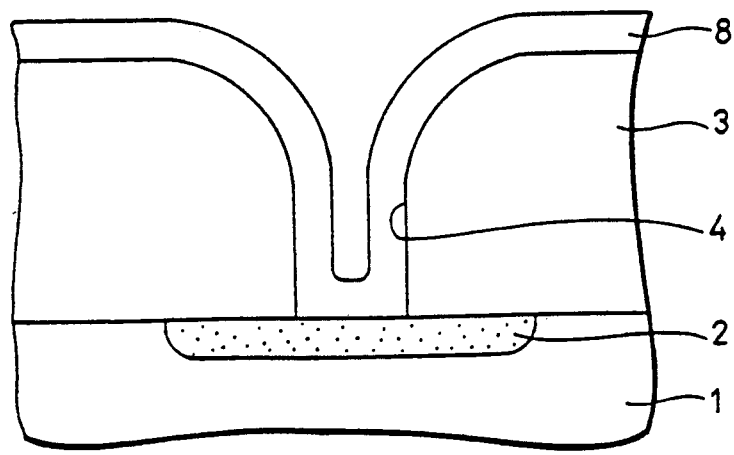
Figure 6B:
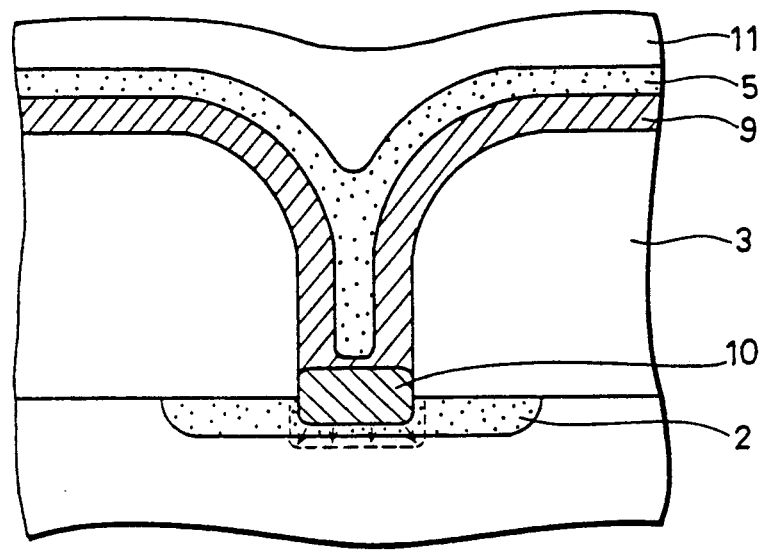

FIGS. 6A and 6B are sectional views showing interconnection structure in which a conventional barrier metal layer is interposed.

Figure 7A:
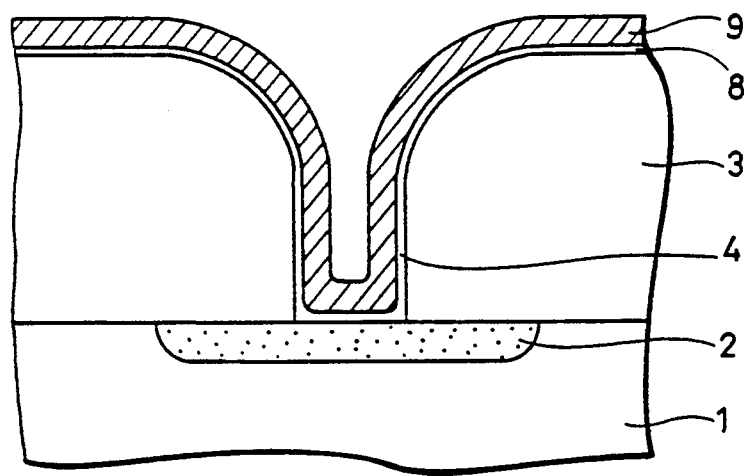
Figure 7B:
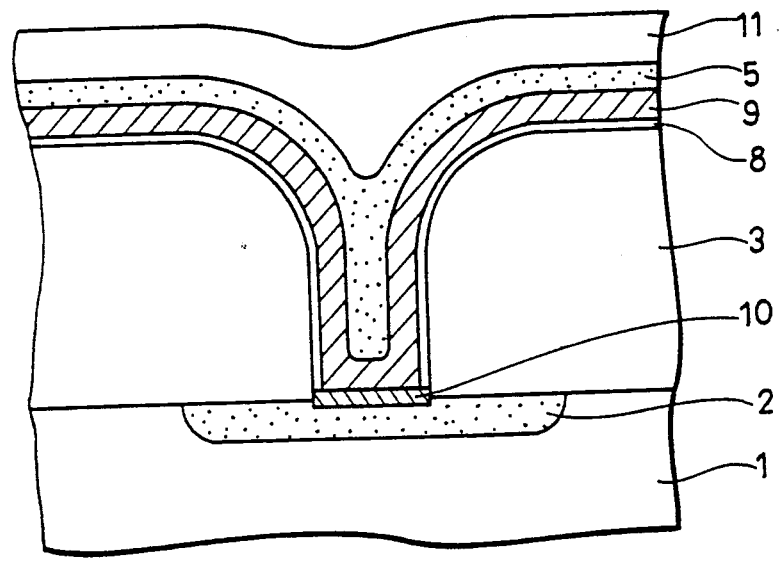

FIGS. 7A and 7B are sectional views showing another example of an interconnection structure in which a conventional barrier metal layer is interposed.

Figure 8:
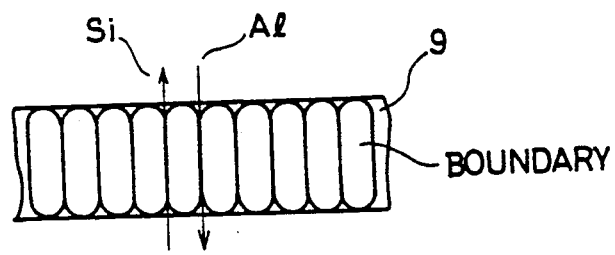

FIG. 8 is a schematic diagram of a crystal structure of the titanium nitride layer formed by the reactive sputtering.

DESCRIPTION OF THE PREFERRED EMBODIMENTS

One embodiment of the present invention will be described in detail with reference to drawings in the following.

Figure 1:
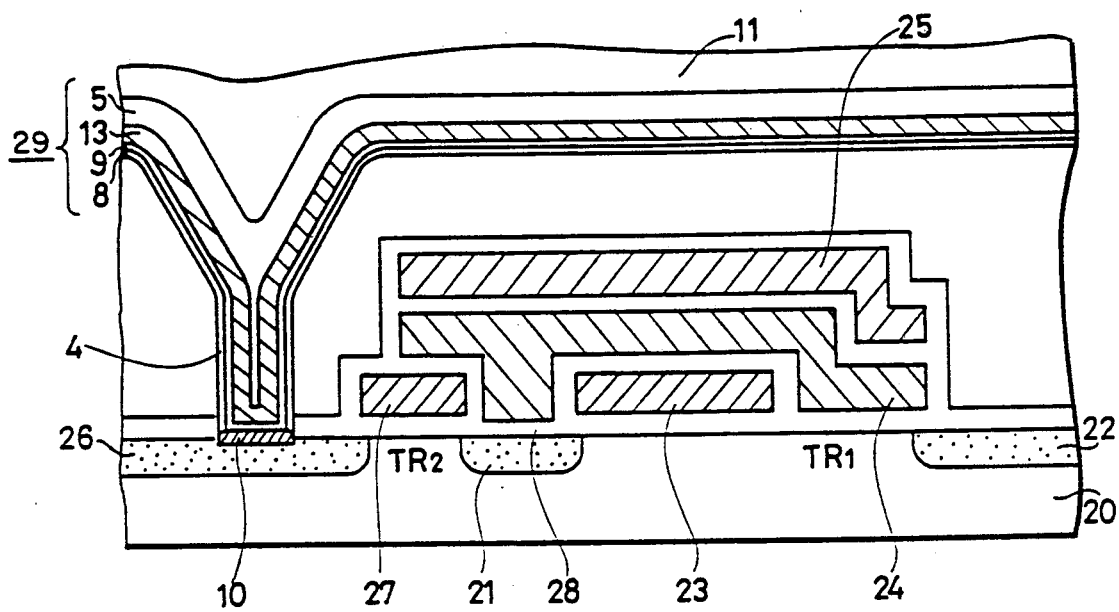
FIG. 1 is a sectional view of a structure of a memory cell of EEPROM according to one embodiment of the present invention.

Referring to FIG. 1, EEPROM (Electrically Erasable and Programmable Read Only Memory) comprises a floating gate transistor TR1 and a selecting transistor TR2 formed on a major surface of a semiconductor substrate 20.

The floating gate transistor TR1 comprises source and drain regions 21 and 22 formed on the major surface of the semiconductor substrate 20, a first control gate 23 formed on the semiconductor substrate 20 through an insulating film, a floating gate 24 formed over the first control gate 23 through the insulating film, and a second control gate 25 formed over the floating gate 24 through the insulating film. The source and drain regions 21 and 22 are formed by diffusing impurities of a conductivity type opposite to that of the semiconductor substrate 20 on the major surface of the semiconductor substrate 20.

The selecting transistor TR2 comprises the source region 21 formed on the major surface of the semiconductor substrate 20, a drain region 26 formed spaced apart from the source region 21, and a selecting gate 27 formed on the major surface of the semiconductor substrate 20 through the insulating film.

A tunnel region 28 is formed between the floating gate transistor TR1 and the selecting transistor TR2. A bit line 29 is connected to the drain region 26 of the selecting transistor TR2 through a contact hole 4.

Figure 2A:
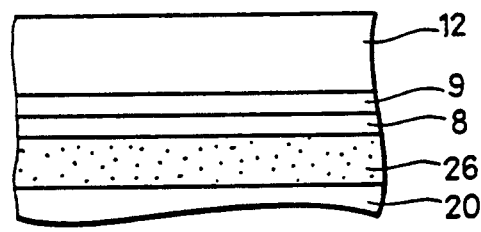
FIGS. 2A and 2B are sectional views schematically showing a structure of a bit line of the memory cell of the EEPROM of FIG. 1 in sequential steps of manufacturing the bit line.
Figure 2B:
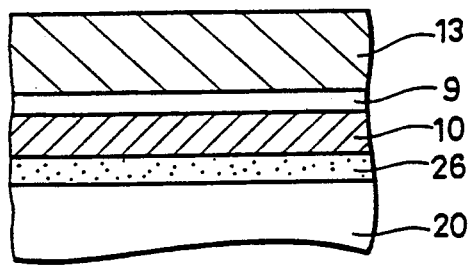

In the EEPROM, the interconnection structure of the present invention is applied to the bit line 29. A structure of the bit line 28 will be described in detail in reference to FIGS. 2A and 2B. FIGS. 2A and 2B specifically show the interconnection structure of the contact portion of the bit line 29.

Figure 3:
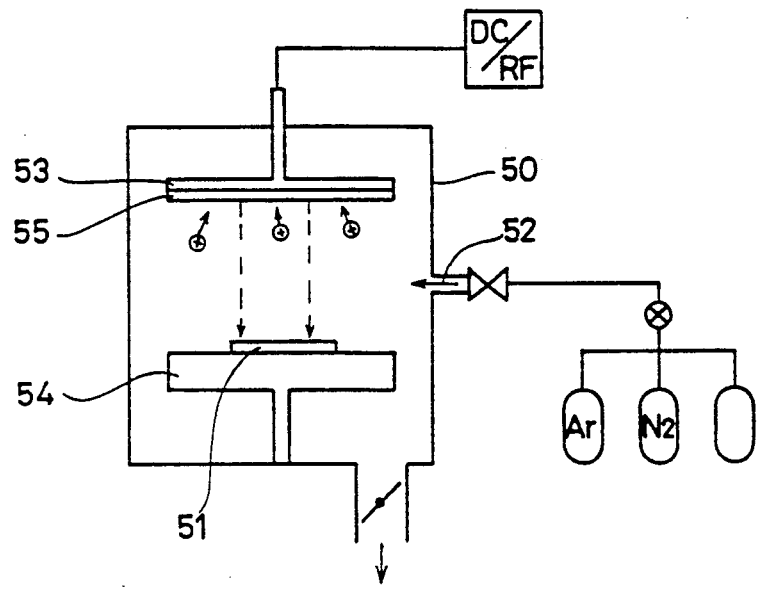
FIG. 3 is a schematic diagram of a structure of a sputtering device.

First, as shown in FIG. 2A, a titanium layer 8 of a film thickness of 200Å is deposited on the major surface of the semiconductor substrate 20 in which the drain region 26 is formed. The film thickness of the titanium layer 8 is selected such that a film thickness of a titanium silicide layer 10 to which the titanium layer changes in the later step is about 200Å–1,000Å. The minimum thickness 200Å of the titanium layer 8 is limited by a practical limit for forming a thin film, and the maximum thickness 1000Å is set to a value such that a pn junction of an impurity region to which the titanium silicide layer 10 is connected is not destroyed. The titanium layer 8 is formed using sputtering method in an argon atmosphere. Then, a titanium nitride layer 9 is deposited on a surface of the titanium layer 8 to a thickness of 200Å. The titanium nitride layer 9 is formed using a reactive sputtering method in a nitriding atmosphere. The titanium nitride 9 layer 9, as shown in FIG. 8, has the crystal structure extending in a direction of its film thickness in the form of columns. Then, a second titanium layer 12 is formed on a surface of the titanium nitride layer 9 to a thickness of 800Å. The second titanium layer 12 is formed using sputtering method in an argon atmosphere. FIG. 3 shows an outline of a sputtering device. The above described sputtering or reactive sputtering are performed using the device. A wafer 51 is placed on an upper surface of a substrate electrode (anode). An inert gas 52 such as Ar, or a reactive gas 52 in case of a reactive sputtering, is introduced into a chamber 50. Application of a predetermined potential to a cathode 53 causes inert gas ions to collide with a target 55, producing atoms or molecules from the target 55. Then, the atoms or the molecules are deposited on a surface of the wafer 51, so that a film is formed. Selection between a sputtering and a reactive sputtering is made by selecting the gas to be introduced into the chamber 50. Thus, the first titanium layer 8, the titanium nitride layer 9 and the second titanium layer 12 are formed in the same chamber by a sequential step.

Now, as shown in FIG. 2B, the semiconductor substrate in which the three-layered structure is formed is annealed in the nitriding atmosphere. The annealing process is performed using a lamp annealing device at 800° C. for about 30 sec. The annealing process converts the first titanium layer 8 formed in contact with the semiconductor substrate 20 into the titanium silicide layer 10 of a film thickness of about 300–400Å. The titanium silicide layer 10 is formed slightly extending into the drain region 26 of the semiconductor substrate 20. In addition, the most upper second titanium layer 12 is converted into a titanium nitride layer 13 of a film thickness of 800Å. Since the titanium nitride layer 13 is formed by annealing process as described above, the close packed polycrystalline structure is made. The titanium nitride layer formed by the thermal processing at a high temperature shows no definite grain boundary and is considered to have a crystal structure of coalescence of fine polycrystals. The titanium nitride layer formed by the thermal processing at a high temperature also has a length of grain structure in the direction of thickness of the layer which is substantially less than the thickness of the layer.

Thereafter, a conductive layer 5 of aluminum or refractory metal is formed on a surface of the titanium nitride layer. Then, a protection film 11 such as plasma CVD oxide film is formed thereon.

The interconnection layer 28 formed by interposing barrier metal layers having such a three-layered structure can form a good ohmic contact with the drain region 26. A titanium nitride layer 13 interposed between the conductive layer 5 and the drain region 26 has a close packed crystal structure and an excellent barrier characteristic. Accordingly, increase of interconnection resistivity due to alloy spike phenomenon or formation of a silicon nodule can be completely prevented.

Figure 4:
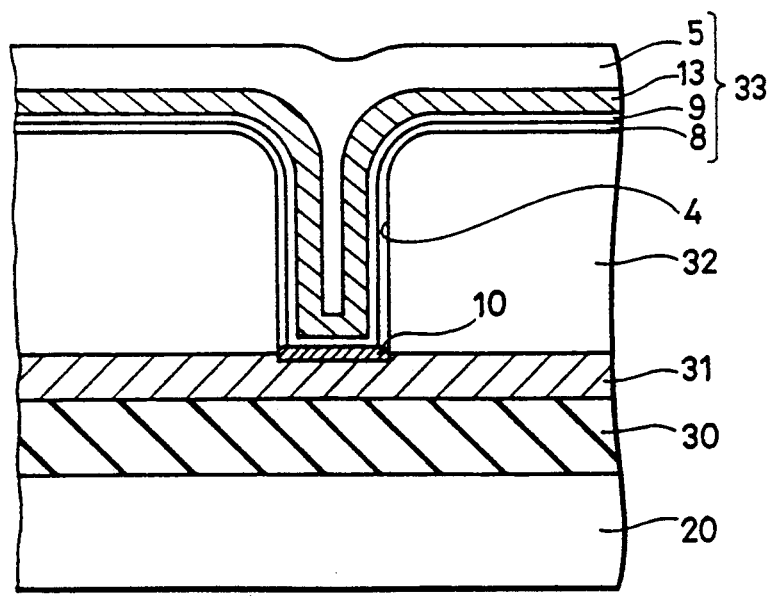
FIG. 4 is a sectional schematic diagram of an interconnection layer directly connected to a conductive layer according to the present invention.
Figure 5A:
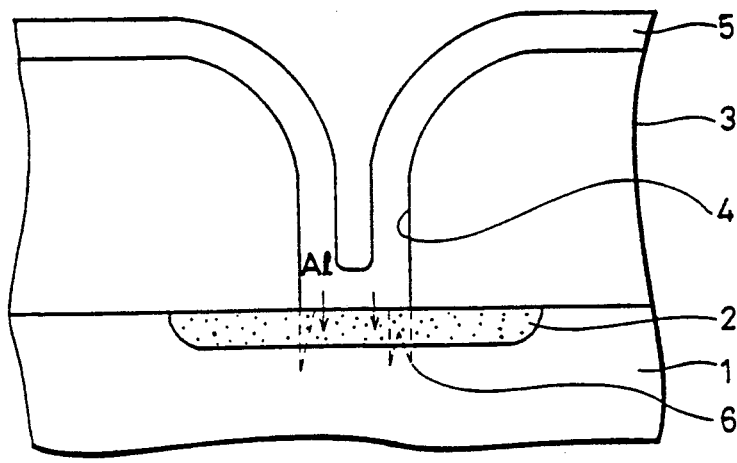
Figure 5B:
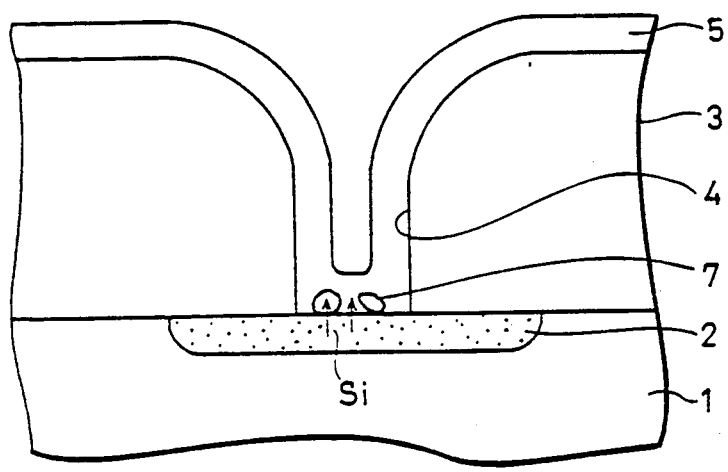

FIG. 4 shows a sectional structure of the interconnection layer according to the present invention connected to the gate electrode 27, the second control gate 25 and the like. Interconnection layer 33 is formed on a surface of an interlayer insulating layer 32 and is connected to a surface of a conductive layer 31 formed of polycrystalline silicon through the contact hole 4. The conductive layer 31 is formed on the field oxide film 30. A barrier metal layer included in the interconnection in the contact portion is comprised of the titanium silicide layer 10, the first titanium nitride layer 9 formed by annealing and the second titanium nitride layer 13 formed by the reactive sputtering. This interconnection structure produces the same effect as that of the above described embodiment.

Other embodiments described in the following can be applied to a barrier metal layer having the above described three-layered structure. In the following table, starting from the side adjacent to the major surface of the semiconductor substrate, comes the first layer, the second layer and the third layer. All combinations are applicable for materials between layers. This structure also allows an excellent barrier characteristic and a good ohmic contact.

TABLE 1

| | material | forming method |
|---|---|---|
| first layer | titanium silicide tungsten silicide | forming titanium or tungsten layer by sputtering or CVD method, then performing thermal process |
| second layer | titanium nitride tungsten nitride | reactive sputtering or CVD method |
| third layer | titanium nitride tungsten nitride | forming titanium or tungsten layer by sputtering or CVD method, then performing thermal process |

Although in the above described embodiment, description is given of an example in which interconnection structure of the present invention is applied to the bit line 28 of the EEPROM, the present invention is not limited to this, but applicable to an interconnection layer of various semiconductor devices.

In addition, a material used for a conductive layer is not limited to aluminum.

Since an interconnection structure according to the present invention is formed by interposing a barrier metal layer between the surface of the semiconductor substrate or the like and the conductive layer, and the barrier metal layer is formed of three-layers, each having a different function, the interconnection structure having a good ohmic contact and an excellent barrier characteristic can be implemented without increase of the interconnection resistivity due to the alloy spike phenomenon or formation of nodule.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An interconnection layer for a semiconductor device, comprising:
    a refractory metal silicide layer formed on a surface of a silicon layer;
    a first refractory metal nitride layer formed on said refractory metal silicide layer by a sputtering process so as to provide said first refractory metal nitride layer with a first crystalline structure;
    a second refractory metal nitride layer formed on said first refractory metal nitride layer by thermal nitriding process so as to provide said second refractory metal nitride layer with a second crystalline structure which differs from said first crystalline structure of said first refractory metal nitride layer, said second crystalline structure comprising a close packed structure; and
    a conductor layer on said second refractory metal nitride layer.

2. An interconnection layer according to claim 1, wherein said first refractory metal nitride layer is formed by a CVD process.

3. An interconnection layer for a semiconductor, comprising:
    a refractory metal silicide layer formed on a surface of a semiconductor substrate;
    a refractory metal nitride first layer formed on said refractory metal silicide layer having a length of grain structure in the direction of thickness of said first layer that is equal to said first layer thickness;
    a refractory metal nitride second layer formed on said refractory metal nitride first layer having a length of grain structure in the direction of thickness of said second layer that is substantially less than said second layer thickness; and
    a conductor layer formed on said refractory metal nitride second layer.

4. A semiconductor memory device comprising an interconnected layer having a multi-layered structure, comprising:
    a first conductivity type of semiconductor substrate having a major surface,
    a second conductivity type first, second and third impurity regions formed spaced apart from each other by a predetermined space on the major surface of said semiconductor substrate,
    a gate electrode formed between said first and second impurity regions of the major surface of said semiconductor substrate through a first insulating layer,
    a first control gate formed between said second and third impurity regions of the major surface of said semiconductor substrate through a second insulating layer,
    a floating gate formed on a surface of said first control gate through a third insulating layer,
    a second control gate formed on a surface of said floating gate through a fourth insulating layer,
    an interconnection layer connected to said first impurity region through a contact hole,
    said interconnection layer further comprising,
    a refractory metal silicide layer formed on a surface of said first impurity region;
    a first refractory metal nitride layer formed on said refractory metal silicide layer by a sputtering process so as to provide said first refractory metal nitride layer with a first crystalline structure;
    a second refractory metal nitride layer formed on said first refractory metal nitride layer by a thermal nitriding process so as to provide said second refractory metal nitride layer with a second crystalline structure which differs from said first crystalline structure of said first refractory metal nitride layer, said second crystalline structure comprising a close packed structure; and
    a conductor layer on said second refractory metal nitride layer.

5. A semiconductor memory device according to claim 4, wherein said first refractory metal nitride layer is formed by a CVD process.

* * * * *